United States Patent [19]

Jain

[11] Patent Number: 4,991,962

[45] Date of Patent: Feb. 12, 1991

[54] HIGH PRECISION ALIGNMENT SYSTEM FOR MICROLITHOGRAPHY

[76] Inventor: Kantilal Jain, 18 Algonquian Trail, Briarcliff Manor, N.Y. 10510

[21] Appl. No.: 293,778

[22] Filed: Jan. 4, 1989

[51] Int. Cl.$^5$ .............................................. G01B 9/02
[52] U.S. Cl. .................................... 356/349; 356/352; 356/356
[58] Field of Search ....................... 456/349, 352, 356

[56] References Cited

U.S. PATENT DOCUMENTS 4,332,473  6/1982  Ono ..................................... 356/356
4,631,416 12/1986  Trutna, Jr. ...................... 356/356 X
4,838,693  6/1989  Uchida et al. ....................... 356/356

OTHER PUBLICATIONS

Jackson et al., "Confocal Fabry-Perot Sensor", *Electronics Letters*, vol. 18, No. 5, pp. 227–229, Mar. 1982.

*Primary Examiner*—Davis L. Willis
*Assistant Examiner*—Matthew W. Koren
*Attorney, Agent, or Firm*—Carl Kling

[57] ABSTRACT

This invention discloses a high-precision alignment system for aligning a mask with a wafer in a high-resolution microlithography system. This alignment system has a high-sensitivity mask-wafer displacement detection system characterized by an optical heterodyne technique that uses two laser frequencies to generate by diffraction and interference a displacement signal at a different frequency, and has a high-precision mask-wafer positioning system that uses a laser modulation spectroscopic technique characterized by controlling the cavity spacing of a highly stable optical resonator with a modulated frequency-stabilized laser, making it possible to align a wafer pattern with a mask pattern with a precision on the order of a few nanometers.

16 Claims, 3 Drawing Sheets

HIGH PRECISION ALIGNMENT SYSTEM FOR MICROLITHOGRAPHY

BACKGROUND OF THE INVENTION

1. Field of the Invention

This invention relates to alignment systems for aligning a pattern on one object to a pattern on another object, and more particularly relates to alignment method and apparatus for aligning a mask with a wafer in a high-resolution microlithography system, having a high-sensitivity mask-wafer displacement detection system characterized by an optical heterodyne technique that uses two laser frequencies to generate by diffraction and interference a displacement signal at a different frequency, and having a high-precision laser-modulation mask-wafer positioning system characterized by controlling the cavity spacing of a highly stable optical resonator with a modulated frequency-stabilized laser, making it possible to align a wafer pattern with a mask pattern with a precision on the order of a few nanometers.

2. Description of the Prior Art

Lithography systems are extensively used in the production of integrated circuit chips and electronic circuit boards. Such systems typically include an exposure source such as a high intensity lamp or a laser or source of other radiation, mask and substrate positioning systems, a projection system to illuminate and image the pattern present on the mask onto the substrate, and an alignment system to accurately position the mask and the wafer with respect to each other prior to exposure. The intent typically is to illuminate a wafer coated with a layer of a radiation-sensitive material so as to produce the desired circuit pattern, which later will be metallized or otherwise activated during further processing. During production of integrated circuit chips, a wafer typically undergoes numerous physical treatment steps following illumination through several different masks. This requires that prior to exposure using each new mask, the wafer position be precisely realigned with respect to the new mask so as to carry out each process step at the desired microscopic physical locations as dictated by the preceding process steps. The precision of such alignment typically must be a small fraction of the minimum feature size of the circuit patterns.

As the demand for chips with ever greater memory and processing power increases, the individual bits on the chips get smaller in size. This requires that the lithography equipment used for imaging these patterns have higher and higher resolution. Simultaneously, the reduced minimum feature size of the circuit patterns demands that successive mask levels be aligned with respect to each other with ever greater accuracy. For example, in production of 1 Mb (megabit) and 4 Mb memory chips using, respectively, 1 micron and 0.7 micron geometries, the lithography system typically must have an alignment precision of 0.3 micron and 0.2 micron, respectively. Lithography systems for producing 16 Mb devices will need to have an alignment capability of 0.15 micron, and it is expected that production of 64 Mb chips will demand that lithography apparatus possess alignment precision of 0.1 micron or better. Performance of current alignment technology as seen in today's lithography tools is limited in accuracy in the 0.2–0.3 micron range.

Prior art alignment approaches have used various techniques for sensing the relative positions of the mask and the wafer. All approaches rely on detecting certain targets, fabricated on the mask and the wafer prior to the alignment step. The targets are illuminated by light and through scattering, reflection, diffraction or interference, they produce light signals which are detected and analyzed to determine the relative displacement required between the mask and the wafer to bring them in the desired alignment. A common approach found in the prior art uses mask and wafer targets that are sets of etched lines in a reflective background and arranged in the form of squares or chevrons. The targets are illuminated with visible light and the beams reflected from them are observed simultaneously in a viewing system. In the viewing microscopes the target backgrounds appear bright due to directly reflected light whereas the etched lines appear dark due to light being scattered out of the collection angles of the microscope objectives. The alignment process consists in aligning the line patterns of the two targets as seen in the viewing system by producing the appropriate relative displacement between the mask and the wafer using a conventional laser interferometer. This alignment approach achieves a precision of 0.25–0.30 micron.

Another approach used in prior art, known as dark-field alignment method, consists in fabricating on the wafer a pattern that is a set of rectangles and fabricating on the mask a pattern that is a set of parallel slits which, under perfect mask-wafer alignment, are imaged on the edges of the rectangles on the wafer. The lens which collects the light scattered from the wafer is so apertured that all specular reflection, i.e. directly reflected light, is blocked. Thus, the detector sees only those light rays which are scattered from the edges of the rectangular targets on the wafer. By optimizing the mask and wafer positions such that the transmission of these scattered rays through the slits on the mask is maximized, the mask and the wafer are brought in alignment. The required relative displacement between the mask and the wafer is accomplished, as above, by use of a conventional laser interferometer, delivering an overall alignment accuracy in the 0.20–0.25 micron range.

Other prior art approaches have used diffraction gratings as alignment targets. The intensity or phase information in light diffracted from a wafer grating (and in some cases, again through a mask grating) is appropriately analyzed so as determine the relative mask-wafer displacement necessary to produce alignment. Again, in systems using diffraction grating targets, the relative mask-wafer displacement is carried out using conventional laser interferometers, and the alignment precision achieved lies in the vicinity of 0.20 micron. Although optical phenomena and techniques exist that in principle are sensitive to finer physical displacements, none have been developed in a way that makes them suitable for lithography alignment systems.

In view of the limitations in prior art as discussed above, there is an important need to develop a superior alignment system for high-resolution lithography machines to deliver greater mask-wafer alignment precision that will be required in the fabrication of higher-density microelectronic devices.

SUMMARY OF THE INVENTION

The object of the invention is to provide a lithography alignment system that is capable of aligning with high precision a wafer with a mask. It is accomplished by observing alignment targets on the mask and the wafer, generating an error signal corresponding to the misalignment between them, producing a precise relative displacement between them to bring them in alignment, and controlling the overall process with locking control electronics to ensure the desired precision of alignment.

A feature of the invention is the provision of multiple diffraction gratings on both mask and wafer as alignment targets by which an incident collimated alignment beam is double-diffracted into various orders which pass through the lithography projection lens and are made to mutually interfere to generate a displacement error signal.

Another feature of this invention is an arrangement of the alignment targets in such a way that symmetrical diffraction orders from two mask gratings are incident on one wafer grating and generate wafer diffraction orders which travel collinearly so that the displacement error signal is not critically dependent on the wafer focus position.

Another feature of the invention is the illumination of the alignment targets with two laser frequencies which have different polarizations, and producing interference between pairs of collinear double-diffracted beams so as to generate a heterodyne detection signal at a frequency equal to the difference between the two incident laser frequencies.

Another feature of this invention is the provision of a highly stable and precisely controllable optical resonator, coupling the mask and wafer stages to the mirrors of this resonator, and adjusting the fine tuning of the resonator cavity spacing to produce a precise displacement between the mask and the wafer.

Another feature of the invention is stabilizing the above optical resonator by laser modulation spectroscopy such that the resonator cavity spacing is locked to a sideband frequency of a modulated frequency-stabilized laser, and producing the desired changes in the resonator cavity spacing by altering the modulation frequency.

Still another feature of the invention is an integrated feedback control system that communicates between the laser modulation locking system of the optical resonator to which the mask and wafer stages are coupled, and the optical heterodyne detection system that produces the mask-wafer displacement error signal, in such a way that the error signal causes the modulation frequency to change, which produces a corresponding change in the resonator spacing so as to bring the mask and the wafer in precise alignment.

The advantage of the invention is its ability to provide not only high positioning accuracy with a laser modulation spectroscopic technique, but also high detection sensitivity with an optical heterodyne method, which, combined with the advantages of passing the alignment beams through the imaging lens and wafer focus insensitivity, provide for a versatile high-precision alignment system for high-resolution microlithography machines.

Other objects, features and advantages of the invention will be apparent to those skilled in the art by understanding the description of the preferred embodiments as explained in the following text and as illustrated in the accompanying drawings.

DESCRIPTION OF THE PREFERRED EMBODIMENT

Figure 1:
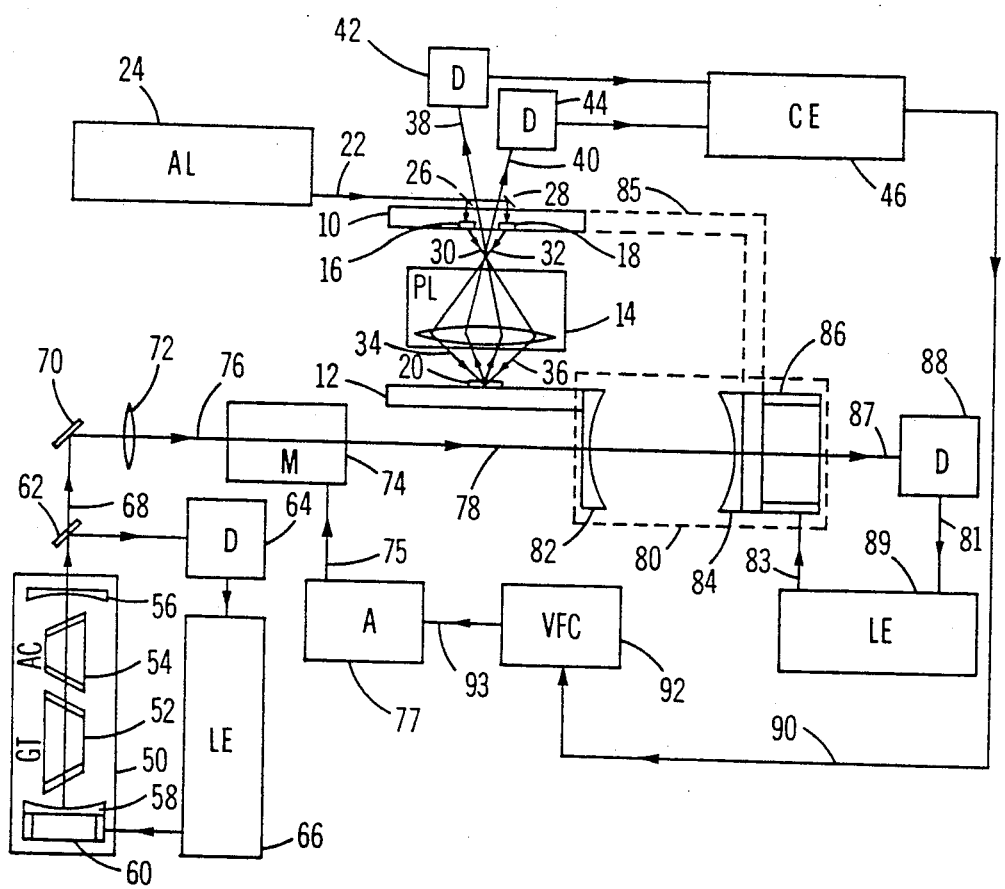
FIG. 1 is a composite illustration of a high-precision microlithography alignment system, showing a through-the-lens double-diffraction optical heterodyne displacement detection system and a laser modulation spectroscopic fine positioning system that controls relative mask-wafer displacement through precise cavity tuning of a highly stable optical resonator.

A high-precision alignment system comprising a stage positioning system using laser modulation spectroscopy and a displacement detection system using optical heterodyning with double diffraction through the projection lens is schematically illustrated in FIG. 1. The objective is to align mask stage 10 and wafer stage 12 so that projection lens 14 will produce an image of a mask chip-field at the desired location on the wafer. This is done by positioning accurately a pair of mask targets 16 and 18 with respect to a wafer target 20. Targets 16, 18 and 20 are diffraction gratings and will be described in greater detail later. The output beam 22 from an alignment laser 24 is split by beamsplitters 26 and 28 into two beams which illuminate the mask targets 16 and 18 at normal incidence. The mask targets, acting as transmission gratings, diffract the incident beams into various mask-grating orders. A diffracted beam 30 from target 16 and a diffracted beam 32 from target 18 are collected by projection lens 14 to illuminate wafer target 20. Target 20, acting as a reflection grating, diffracts these incident beams 34 and 36 into various wafer-grating orders. Four of these wafer-grating orders are collected by projection lens 14 as beams 38 and 40 and analyzed by detectors 42 and 44. Each of the beams 38 and 40 is a combination of a wafer diffraction order of beam 34 and a different wafer diffraction order of beam 36. Alignment laser 24 is such that its output 22 contains two closely spaced frequencies $w_1$ and $w_2$. Thus, since the incident radiation on the three gratings comes from a two-frequency source, each of the diffraction orders also contains a component at each of the two laser frequencies $w_1$ and $w_2$. Further, laser 24 is such that the $w_1$ and $w_2$ components of its output have different polarizations, and detectors 42 and 44 are such that they include polarization mixers at their inputs. This causes the $w_1$ and $w_2$ components in each of the beams 38 and 40 to interfere with each other and produce a heterodyne signal at a frequency $w_1 - w_2$. The intensities and phases of these heterodyne signals of frequency $w_1 - w_2$ from detectors 42 and 44 contain information about the relative displacement of wafer grating 20 with respect to mask gratings 16 and 18, and are further processed by control electronics 46 to generate a signal that is used, as described later, to produce the desired displacement between the wafer and the mask so as to bring them in alignment. A detailed description of the diffraction phenomena that take place at gratings 16, 18 and 20 and generate various interference signals will follow with reference to FIG. 2.

Continuing with FIG. 1, we next describe the high-precision positioning system that utilizes a laser modulation spectroscopic technique to sense and produce displacements with an accuracy on the order of a few Angstroms. A helium-neon laser 50 is first frequency-stabilized by locking its wavelength to a fundamental molecular transition of a suitable material, such as iodine. Laser 50 consists of helium-neon gain tube 52, iodine-vapor absorption cell 54, laser cavity mirrors 56 and 58, and piezoelectric transducer 60. A part of the output beam of laser 50 is reflected by beamsplitter 62 into detector 64. The output from detector 64 is used by locking electronics 66 to send a control voltage to transducer 60 so as to optimally tune mirrors 56 and 58 such that the output power of laser 50 is maximized. Thus optimized beam 68 is maneuvered by mirror 70 and lens 72 into a frequency modulator 74, which modulates the incident beam 76 of frequency w with input 75 from an rf amplifier 77 at an rf frequency $w_m$, producing sidebands at frequencies $w+w_m$ and $w-w$. The modulated beam 78 next enters a resonator 80 which consists of resonator cavity mirrors 82 and 84 and piezoelectric transducer 86. The cavity spacing of resonator 80 is so tuned that only one of the sideband frequencies, say $w+w_m$, is transmitted through it. Further, the tuning of resonator 80 is kept locked to $w+w_m$ by monitoring the output 87 with detector 88, feeding the detector signal to locking electronics 89, and driving piezoelectric transducer 86 with a control signal from locking electronics 89 in such a way that output 87 is maximized. The cavity spacing of resonator 80 may be stabilized at a different value by using a different modulation frequency $w_m$; whenever $w_m$ is changed, resonator output 87 will deviate from its previously maximum value, causing detector 88 to instruct locking electronics 89 to drive piezoelectric transducer 86 so as to retune resonator 80 for maximum transmission at the new value of $w+w_m$. Resonator 80 can be readily so designed that a 1 MHz deviation in $w_m$ will increment the spacing between mirrors 82 and 84 by 1 Angstrom. This extremely fine positioning capability of such a system is next coupled with the previously described optical heterodyne mask-wafer displacement detection system (10-46) as follows.

Variations in the cavity spacing of resonator 80 are transferred into a relative displacement between mask and wafer stages 10 and 12 by affixing one mirror, 82, of resonator 80 to wafer stage 12 and coupling the other mirror, 84, to mask stage 10 by link 85. Beams 38 and 40, as described previously, reach detectors 42 and 44 and generate heterodyne signals which contain information about mask-wafer displacement. These signals are processed by control electronics 46 to generate a voltage signal 90, a correction signal which produces the correction necessary to bring the mask and wafer stages in desired alignment. Signal 90 is fed to a voltage-to-frequency converter 92, which produces an rf output 93 whose frequency $w_m'$ varies in proportion to signal 90. The difference between $w_m'$ and the previous modulating frequency $w_m$ is a measure of the mask-wafer displacement. Signal 93 is amplified by rf amplifier 77 to produce output 75 which is used by modulator 74 to modulate incident beam 76, leading to sidebands at frequencies $w+w_m'$ and $w-w_m'$ in beam 78. Resonator 80, which was previously optimally tuned to frequency $w+w_m$, now has less-than-maximum transmission at the new sideband frequency $w+w_m'$. This change, detected by detector 88 providing a signal on line 81 which, causes locking electronics 89 via line 83 to drive piezoelectric transducer 86 and move mirror 84 in such a way that the cavity spacing of resonator 80 is tuned to frequency $w+w_m'$. Link 85 transfers the displacement of mirror 84 to mask stage 10, bringing it in the desired alignment with wafer stage 12.

Figure 2:
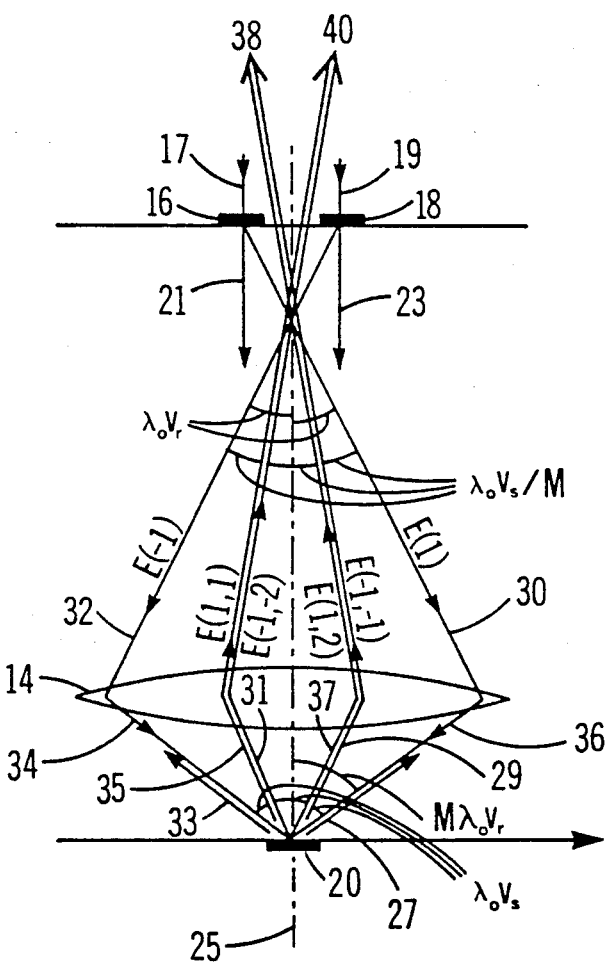
FIG. 2 shows various beams produced as a result of diffraction of two incident beams, first from two mask grating targets and then from a wafer grating target. The spatial frequencies of the mask and wafer gratings are so related that double-diffracted beams $E(1,1)$ and $E(-1,-2)$, and $E(-1,-1)$ and $E(1,2)$, are mutually collinear, producing heterodyne interference signals which vary with the mask-wafer displacement.

Referring to FIG. 2, we now describe how various beams are diffracted at mask and wafer gratings 16, 18 and 20 and how various interference signals are generated. Mask gratings 16 and 18 are fabricated to have lines with a spatial frequency $v_r$. (Thus, each of these gratings has $v_r$ lines per unit distance, or, a spatial repetition period $1/v_r$ in a direction orthogonal to the grating lines.) They are illuminated at normal incidence by light beams 17 and 19 from alignment laser 24 (FIG. 1). These beams are diffracted by gratings 16 and 18 into various orders, of which FIG. 2 shows the zero orders E(0) (beams 21 and 23), the +1 order E(1) (beam 30) from grating 16 and the −1 order E(−1) (beam 32) from grating 18. If the alignment laser has a wavelength $\lambda$, the first-order [E(±1)] diffracted beams 30 and 32 make an angle $\lambda_o v_r$ with the optical axis 25 of the system. They are collected by projection lens 14 and made to be incident on wafer grating 20 as beams 36 and 34, each now making an angle $M\lambda_o v_r$ with optical axis 25, where M is the reduction ratio of lens 14. Beams 34 and 36 are next diffracted by grating 20 into various orders which we denote as E(k,l), in which k indicates the diffraction order from mask grating 16 or 18, and l indicates the diffraction order from wafer grating 20. The phase of each of these double-diffracted beams E(k,l) varies with the relative displacement of wafer grating 20 with respect to mask gratings 16 and 18. Hence the mask-wafer displacement can be determined by analyzing beams E(k,l). FIG. 2 illustrates beam 34 [mask order E(−1)] diffracting from wafer grating 20 into three wafer orders E(−1,0), E(−1,−1) and E(−1,−2), shown as beams 27, 29 and 31, respectively. Similarly, beam 36 [mask order E(1)] diffracts into wafer orders E(1,0), E(1,1) and E(1,2), shown respectively as beams 33, 35 and 37. Wafer grating 20 is fabricated to have lines with a spatial frequency $v_s$. Hence, any two successive wafer orders are separated by an angle $\lambda_o v_s$. Further, spatial frequencies $v_r$ and $v_s$ are so chosen that diffraction orders E(−1,−1) and E(1,2), i.e. beams 29 and 37, are collinear with each other, and diffraction orders E(1,1) and E(−1,−2), i.e. beams 35 and 31, are collinear with each other. These conditions are satisfied by making $v_r$ and $v_s$ such that $$2M\lambda_o v_r = 3\lambda_o v_s, \quad (1)$$

$$v_s = (2M/3)v_r. \quad (2)$$

Now we describe the generation of the heterodyne interference signals when the incident radiation in beams 17 and 19, instead of being of wavelength $\lambda_o$, contains two frequency components $w_1$ and $w_2$. The incident radiation is such that $w_1$ and $w_2$ are separated by a small amount ($\Delta w = w_1 - w_2 \sim$ few hundred kHz; $\Delta w/w_1 \sim 10$), and further, the light at frequency $w_1$ is polarized orthogonally to the light at frequency $w_2$. With two frequencies present in the input beams 17 and 19, each of the diffracted beams (21, 23, 27, 29-37) has a component at $w_1$ and another orthogonally polarized component at $w_2$. Thus, beam 38 is a combination of collinearly travelling diffraction orders $E(-1,-1)$ and $E(1,2)$ (beams 29 and 37), each containing mutually orthogonally polarized components at $w_1$ and $w_2$. Similarly, beam 40 is a combination of collinearly travelling diffraction orders $E(1,1)$ and $E(-1,-2)$ (beams 31 and 35), each containing mutually orthogonally polarized components at $w_1$ and $w_2$. The $w_1$ and $w_2$ components in beam 38, and similarly in beam 40, are made to interfere with each other by having at the inputs of detectors 42 and 44 polarizers with their axes at 45° to the polarizations of $w_1$ and $w_2$. These interference phenomena produce in detectors 42 and 44 signals at the difference frequency $w_1 - w_2$. Since the phase factor of each of the four $E(k,l)$ components in beams 38 and 40 contains information about the relative mask-wafer displacement, the heterodyne interactions discussed above transfer the mask-wafer displacement information to the intensities and phase factors of the detector signals at $w_1 - w_2$. These signals are analyzed by control electronics 46 to generate a control voltage 90 which is used, as described previously, by the laser modulation spectroscopic positioning system, comprising voltage-to-frequency converter 92, rf amplifier 77, frequency modulator 74, resonator 80, detector 88 and locking electronics 89, to precisely drive piezoelectric transducer 86 in such a way that desired alignment between mask stage 10 and wafer stage 12 is produced.

It is important to emphasize that whereas a lateral (i.e. orthogonal to optical axis 25) displacement of the wafer relative to the mask causes a phase shift in the various double-diffracted orders and produces corresponding signals at frequency $w_1 - w_2$, a change in the focal position of the wafer (i.e. a displacement along optical axis 25) does not. This is so because, in the first case, a lateral mask-wafer displacement causes a change in the optical path length difference (and thus, phase shift) between any pair of interfering double-diffracted beams; whereas, in the second case, when the wafer is moved along optical axis 25, no such change in the optical path length difference between interfering beams takes place, first because the beams incident on the wafer (beams 34 and 36) are symmetrically oriented with respect to optical axis 25, and second because the double-diffracted orders which interfere with each other (29 and 37 in beam 38, and 31 and 35 in beam 40) travel collinearly due to the condition $v_s=(2M/3)v_r$. Thus, this invention enables one to monitor and control precise mask-wafer displacements without being critically sensitive to wafer focus position.

In the illustration of FIG. 2, all grating lines run perpendicular to the plane of the paper and produce signals for alignment along the x-axis. A practical alignment system incorporated in a microlithography machine will additionally have a similar set of gratings with lines running perpendicular to the plane of FIG. 2 for alignment in the y-direction. Alternatively, a linear x-grating and a linear y-grating may be combined in the form of a single two-dimensional grating; in this case there are two two-dimensional gratings on the mask and one on the wafer, and these three two-dimensional gratings are then used to accomplish alignment in both x- and y-directions.

Figure 3:
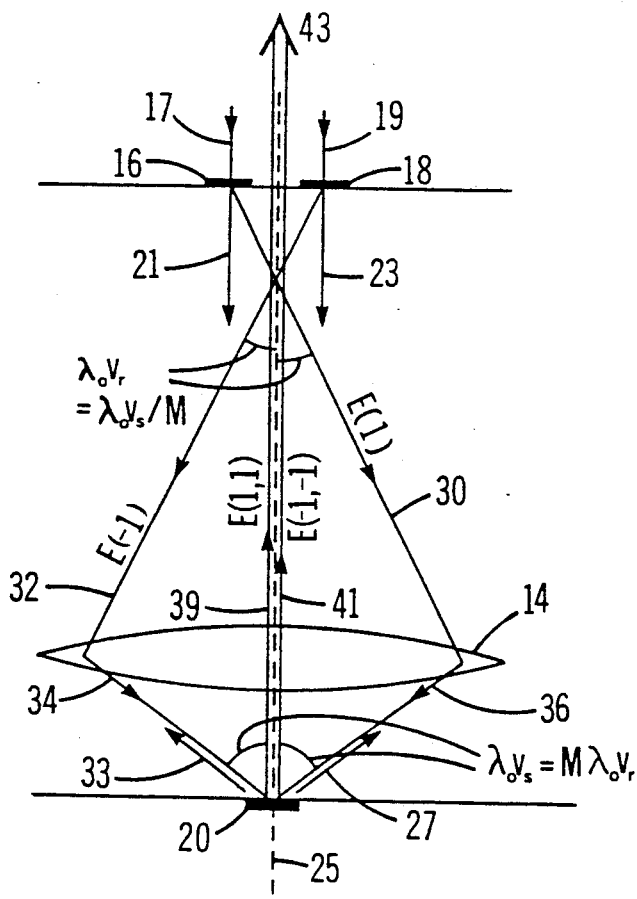
FIG. 3 illustrates an alternate version of the embodiment of FIG. 2; here the mask and wafer grating spatial frequencies are so related that the interfering double-diffraction orders, which produce the heterodyne displacement signal, are $E(1,1)$ and $E(-1,-1)$.

Variations in the above preferred embodiment are made possible by using different sets of double-diffracted beams to interfere with each other; here the mask and wafer gratings are so fabricated that the relationship between their spatial frequencies is different from $v_s=(2M/3)v_r$. FIG. 3 illustrates an example of such an alternative embodiment, showing various beams diffracted from mask and wafer gratings whose spatial frequencies are related by $$v_r = v_s/M. \quad (3)$$

Here, incident beams 17 and 19, containing orthogonally polarized frequency components $w_1$ and $w_2$, are diffracted first by mask gratings 16 and 18 upon which projection lens 14 collects mask orders $E(1)$ and $E(-1)$ (beams 30 and 32), as in FIG. 2, to be incident as beams 36 and 34 on wafer grating 20. These beams are shown as diffracting into wafer orders $E(1,0)$ and $E(1,1)$ (beams 33 and 39) and $E(-1,0)$ and $E(-1,-1)$ (beams 27 and 41). Of these double-diffraction orders, $E(1,1)$ and $E(-1,-1)$ (beams 39 and 41) travel collinearly by virtue of the relationship $v_r=v_s/M$. Heterodyne interference in the composite beam 43 produces the desired signal at frequency $w_1 - w_2$ in the same fashion as in beams 38 and 40 in FIG. 2. This heterodyne signal is processed by control electronics 46 (FIG. 1) to adjust the cavity spacing of resonator 80, as discussed in the description of FIG. 1, so as to produce the desired correction in the mask-wafer displacement.

Figure 4:
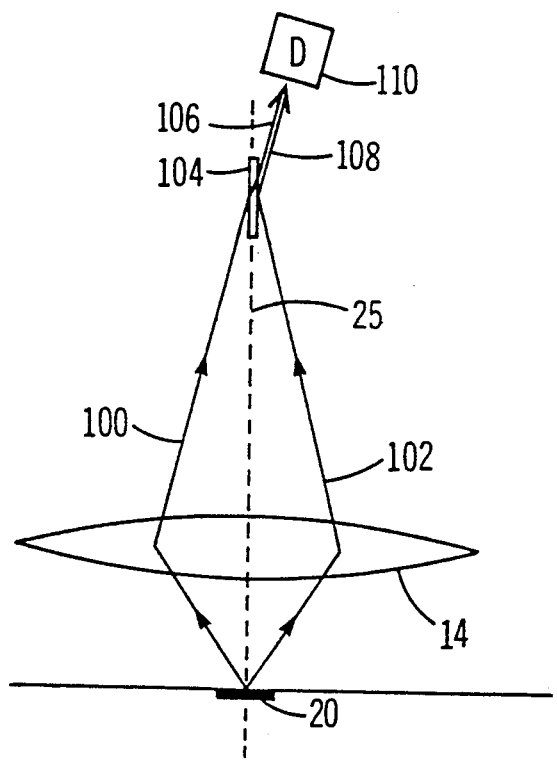
FIG. 4 shows how two beams travelling in different directions can be made to interfere with each other after being made collinear by a beamsplitter.

We may look at the intent of the embodiments of FIGS. 2 and 3 more generally and state that any two double-diffracted beams that interfere with each other need not leave from the wafer grating collinearly; rather, they may leave from the wafer grating in different directions and may later be combined and made collinear with a beamsplitter. As an example, FIG. 4 shows beams 100 and 102 being combined by beamsplitter 104. The transmitted portion 106 of beam 100 travels collinearly with the reflected portion 108 of beam 102 so that beams 106 and 108 interfere, by polarization mixing, in detector 110 to produce the desired heterodyne signal. With this additional freedom to choose the interfering beams, one may now fabricate the mask and diffraction gratings with spatial frequencies other than those that satisfy Equation (2) or (3).

Note that in the embodiments of FIGS. 2-4, any two double-diffracted beams which interfere with each other make equal angles with optical axis 25. This was done, it will be recalled, to make the optical pathlengths of the interfering beams equal so as to render the displacement signal insensitive to wafer or mask movements along the optical axis. However, if the lithography system design is such that dependence of the alignment signal on focusing is not a concern, the above requirement of geometrical symmetry of interfering beams around the optical axis may be relaxed.

We also remark that since each double-diffracted beam contains components at frequencies $w_1$ and $w_2$, one may configure an embodiment which uses only one mask grating and generates the desired detection signal by interference between the $w_1$ and $w_2$ components of only one double-diffracted beam.

In another alternative embodiment of FIG. 1, the piezoelectric transducer 86 may be attached to mirror 82 instead of to mirror 84. In this case a signal from locking electronics 89 will produce the desired change in the mask-wafer displacement by causing the wafer stage, instead of the mask stage, to move.

Further variations in the embodiment shown in FIG. 1 are possible by considering alternatives to the nature of the laser modulation process that takes place in modulator 74. For example, modulator 74 may be an amplitude modulator rather than a frequency modulator, the modulation of beam 76 of frequency w by beam 75 of frequency $w_m$ still resulting in sidebands at frequencies $w + w_m$ and $w - w_m$.

Finally, we remark that the laser modulation spectroscopic technique for precise positioning as described in the preferred embodiment may be used in conjunction with displacement detection methods other than the two-frequency heterodyne techniques discussed above.

METHOD OF OPERATION

The invention carries out the method for providing a high-precision alignment system for aligning a mask stage with a wafer stage in a high-resolution microlithography machine using the following steps:

1. Fabricating on the mask a pair of diffraction gratings having lines which are perpendicular to a certain direction, say, the x-axis, and which have a certain spatial frequency;

2. Fabricating on the wafer a diffraction grating having lines which are perpendicular to a certain direction, say, the x-axis, and which have a spatial frequency related to the mask grating spatial frequency in a certain fashion as described below in step 5;

3. Providing an alignment laser that emits radiation of two frequencies $w_1$ and $w_2$ such that the components at the two frequencies have different polarizations, and illuminating the mask gratings at normal incidence by light from this alignment laser;

4. Providing certain apertures between the mask and wafer gratings such that the +1 diffraction order from one mask grating and the −1 diffraction order from the other mask grating are collected by the projection lens of the microlithography system and made to be incident on the wafer grating;

5. Selecting a ratio between the mask and wafer grating spatial frequencies in such a way that one or more wafer diffraction orders produced by diffraction of the +1 mask diffraction order incident on the wafer grating travel collinearly with one or more wafer diffraction orders produced by diffraction of the −1 mask diffraction order incident on the wafer grating;

6. Collecting one or more pairs of collinear double-diffracted beams, as produced in step 5, by the projection lens of the microlithography system so that each pair is incident on a detector;

7. Causing the two collinear double-diffracted beams in each pair described in step 6 to interfere with each other by placing a polarization mixer at the input of each detector so that each detector produces a heterodyne signal at the difference frequency $w_1 - w_2$ whose phase factor and/or intensity depend on the relative mask-wafer displacement;

8. Providing a control electronics system and processing with it the heterodyne signals produced at the detectors in step 7 to generate a voltage signal and using this voltage signal to produce the required change in the mask-wafer displacement as described below in step 11;

9. Providing a frequency-stabilized laser of frequency w, an rf source of frequency $w_m$ and a modulator, and modulating the output beam from the frequency-stabilized laser in the modulator with output from the rf source to produce a modulated laser beam that contains a sideband at a frequency $w + w_m$ or $w - w_m$;

10. Providing a two-mirror optical resonator system such that (a) one of its mirrors is attached to the wafer stage and the other mirror is mounted on a piezoelectric transducer and linked to the mask stage, and (b) the cavity spacing of the resonator is locked to a sideband frequency ($w + w_m$ or $w - w_m$), produced in step 9, by passing the output beam from the modulator of step 9 through the resonator, measuring with a detector the power in the beam transmitted through the resonator, and inputting the signal from this detector via a locking electronics system to drive the piezoelectric transducer so as to tune the resonator in such a way that the power in the beam transmitted through the resonator is maximized;

11. Inputting the voltage signal generated by the control electronics system of step 8 into the rf source of step 9 so as to change the frequency of the rf source from $w_m$ to $w_m'$, and thereby change the frequency of the sideband of step 9 from $w \pm w_m$ to $w \pm w_m'$, in such a way that the following sequence of events takes place: (a) the resonator, previously tuned for maximum transmission at frequency $w \pm w_m'$, now seeing an input beam at a frequency $w \pm w_m'$, produces a reduced output, (b) this reduced resonator output causes the detector and the locking electronics system of step 10 to drive the piezoelectric transducer of step 10, and thereby move the resonator mirror attached to the piezoelectric transducer, in such a way that the resonator cavity spacing is retuned for maximum transmission at the new sideband frequency $w \pm w_m'$, and (c) the above movement of the resonator mirror causes the mask stage to move, thus altering the mask-wafer displacement by the appropriate amount so as to bring the mask and the wafer in the desired alignment; and 12. Repeating steps 1–11 for a second set of mask and wafer gratings similar to those in steps 1 and 2 but with their lines being perpendicular to y-axis, which is orthogonal to x-axis, so as to produce the desired mask-wafer alignment in the y-direction, as steps 1–11 do in the x-direction.

What is claimed is:

1. The method for providing a high-precision alignment system with optical heterodyne displacement monitoring and laser modulation spectroscopic positioning for aligning a first and second mask/wafer stages in a high-resolution microlithography machine, characterized by the following steps:
   (a) Fabricating on the mask and on the wafer one or more diffraction gratings having periodic features with certain spatial frequencies;
   (b) Providing an alignment laser that emits radiation of two frequencies $w_1$ and $w_2$ such that the components at the two frequencies have different polarizations, and illuminates the mask diffraction gratings producing various mask diffraction orders;
   (c) Providing certain apertures between the mask and wafer gratings such that certain diffraction orders from the mask gratings are collected by the projection lens of the microlithography system and made to be incident on the wafer gratings producing various wafer diffraction orders, which are thus double-diffracted beams as a result of diffraction first from a mask grating and then from a wafer grating;
   (d) Collecting one or more pairs of double-diffracted beams, as produced in step (c), by the projection lens of the microlithography system and combining the two beams in each pair so that they are collinear, and receiving each such pair of collinear double-diffracted beams with a detector;

(e) Causing the two collinear double-diffracted beams in each pair described in step (d) to interfere with each other by placing a polarization mixer at the input of each detector so that each detector produces a heterodyne signal at the difference frequency $w_1 - w_2$ whose phase factor and/or intensity depend on the relative mask-wafer displacement;

(f) Providing a control electronics system and processing with it the heterodyne signals produced at the detectors in step (e) to generate a voltage signal and using this voltage signal to produce the required change in the mask-wafer displacement as described below in step (i);

(g) Providing a frequency-stabilized laser of frequency w, an rf source of frequency $w_m$ and a modulator, and modulating the output beam from the frequency-stabilized laser in the modulator with output from the rf source to produce a modulated laser beam that contains a sideband at a frequency $w + w_m$ or $w - w_m$;

(h) Providing a two-mirror optical resonator system such that: one of its mirrors is attached to the a first mask/wafer stage and the other mirror is mounted on a piezoelectric transducer and linked to the second mask/wafer stage; and, the cavity spacing of the resonator is locked to a sideband frequency ($w + w_m$ or $w - w_m$), produced in step (g), by passing the output beam from the modulator of step (g) through the resonator, measuring with a detector the power in the beam transmitted through the resonator, and inputting the signal from this detector via a locking electronics system to drive the piezoelectric transducer so as to tune the resonator in such a way that the power in the beam transmitted through the resonator is maximized; and (i) Inputting the voltage signal generated by the control electronics system of step (f) into the rf source of step (g) so as to change the frequency of the rf source from $w_m$ to $w_m'$, and thereby change the frequency of the sideband of step (g) from $w \pm w_m$ to $w \pm w_m'$, in such a way that the following sequence of events takes place: first, the resonator, previously tuned for maximum transmission at frequency $w \pm w_m$, now seeing an input beam at a frequency $w \pm w_m'$, produces a reduced output; second, this reduced resonator output causes the detector and the locking electronics system of step (h) to drive the piezoelectric transducer of step (h), and thereby move the resonator mirror attached to the piezoelectric transducer, in such a way that the resonator cavity spacing is retuned for maximum transmission at the new sideband frequency $w \pm w_m'$; and third, the above movement of the resonator mirror causes the mask stage to move, thus altering the mask-wafer displacement by the appropriate amount so as to bring the mask and the wafer in the desired alignment.

2. The method for providing a high-precision alignment system according to claim 1, wherein the mask and wafer gratings have lines which are perpendicular to a certain direction, such as along the x-axis, so that the voltage signal produced in step (f) produces a related change in the mask-wafer displacement in such certain direction; and further including the step of selecting a certain ratio between the mask and wafer grating spatial frequencies such that one or more pairs of double-diffracted beams are formed in such a way that the two beams in each pair travel collinearly as they leave the wafer grating, rather than having been combined after leaving the wafer grating to become collinear as in step (d).

3. The method for providing a high-precision alignment system according to claim 2, in which fabricating step (a) provides diffraction gratings for a first axis and a second axis orthogonal to the first axis, and in which inputting step (i) alters the displacement for alignment in two orthogonal axes.

4. A high precision alignment system comprising:
(a) a first object having one or more diffraction gratings as alignment targets;
(b) a second object having at least one diffraction grating as an alignment target, the alignment targets on said first object and on said second object having a defined locational relationship;
(c) optical means for providing by double diffraction, using the alignment targets, interference signals which are a function of displacement between alignment targets on said first object and said second object;
(d) control electronics operatively connected to said optical means so as to provide a signal output related by the interference signals to the displacement of said first object to said second object;
(e) conversion means operatively connected to said control electronics to provide a displacement-related modulating signal;
(f) frequency stabilized light production means;
(g) modulation means operatively connected to said conversion means and to said frequency stabilized light production means so as to provide a displacement-modulated light signal; and
(h) resonator means, physically connected to said first object and to said second object to provide relative motion between them related to the displacement-modulated light signal.

5. A high-precision alignment system for aligning a first mask/wafer stage (10) with a second mask/wafer stage (12) in a high-resolution microlithography machine, comprising:
(a) mask/wafer displacement signal generating means (42-46), for generating a mask/wafer displacement signal (90) which varies with the relative displacement between a mask (16-18) and a wafer (20) mounted on the first mask/wafer stage (10) and and the second mask/wafer stage (12);
(b) modulated frequency-stabilized laser means (50-76) to produce a modulated laser beam (78) which contains a select sideband at frequency:

$$w + w_m \text{ and/or } w - w_m;$$

where w is a first frequency and $w + w_m$ and $w - w_m$ are sideband frequencies resulting from modulation of w by $w_m$;
(c) optical resonator means (80) having first and second mirrors (82, 84) coupled respectively to said first and said second mask/wafer stages (10, 12), and a piezoelectric transducer (86), having a control input, coupled to said second mirror (84), whereby the cavity spacing is locked to said select sideband frequency as said modulated laser beam (78) passes through; and emerges as a resonator output beam (87);
(d) power locking feedback means (88, 89) for detecting said resonator output beam (87) and locking said piezoelectric transducer (86) at maximum power of said resonator beam (87);

(e) correction signal feedback means, connected to receive input from said correction signal generating means (a) and to provide output to said modulated frequency-stabilized laser means (b), for modifying said mask/wafer displacement signal to change the frequency of the sideband from:

$$+/-w_m \text{ to } +/-w'_m;$$

whereby, said resonator (80), previously tuned for maximum transmission at frequency:

$$w+/-w_m$$

sees an input beam of differing frequency $$w+/-w'_m$$

and produces a changed output resonator beam (87), changing feedback to said piezoelectric transducer (86) to retune for maximum transmission at such differing frequency and thus alters the mask/wafer placement toward the desired alignment.

6. A high-precision alignment system according to claim 5, wherein said first mirror (82) is attached to said first mask/wafer stage (10) directly and said second mirror (84) is mounted on said piezoelectric transducer and coupled by linking means to said second mask/wafer stage (12).

7. A high-precision alignment system according to claim 5, wherein said modulated frequency-stabilized laser means (b) operates by frequency modulation.

8. A high-precision alignment system according to claim 5, wherein said modulated frequency-stabilized laser means (b) operates by amplitude modulation.

9. A high-precision alignment system according to claim 5 wherein the lithography system includes a projection lens (14),
wherein said modulated frequency-stabilized laser means comprises:
a diffraction grating target (16) on the mask and a diffraction grating target (20) on the wafer;
an alignment laser (24) which emits radiation of two frequencies $w_1$ and $w_2$ of differing polarizations, and illuminates said mask diffraction grating target producing various mask diffraction orders;
wherein said mask/wafer displacement signal generating means comprises:
diffraction grating targets respectively on mask and wafer;
certain apertures, arranged between said mask and wafer diffraction gratings in such manner that a certain diffraction order from said mask diffraction grating is collected by the projection lens (14) and made to be incident on said wafer diffraction grating, producing various wafer diffraction orders, including a double-diffracted beam as a result of diffraction first from said mask diffraction grating and then from said wafer diffraction grating, is collected by the projection lens (14);
a set of detector means (42, 44) having polarization mixer means so as to receive such double-diffracted beams from the projection lens (14) and cause the $w_1$ and $w_2$ components to interfere, thus producing a heterodyne signal at the difference frequency $w_1-w_2$, whose characteristics of phase factor and/or intensity depend upon the relative mask/wafer displacement; and
control electronics reactive to such heterodyne signal to provide such mask/wafer displacement signal.

10. A high-precision alignment system according to claim 9, wherein each mask and each wafer includes at least one diffraction grating target, wherein said detector means comprises a plurality of detectors each receiving a plurality of such double-diffracted beams combined to be collinear, each of said plurality of detectors producing a heterodyne signal at the difference frequency $w_1-w_2$, whose characteristics of phase factor and/or intensity depend upon the relative mask/wafer displacement.

11. A high-precision alignment system according to claim 10, wherein each mask (10) includes a plurality of diffraction gratings (16, 18) and each wafer (12) includes at least one diffraction grating (20);
wherein a selected first diffraction order (30) from a first mask diffraction grating (16) and a selected second order (32) from a second mask diffraction grating (18) are collected by the projection lens and made to be incident on said wafer grating (20), the two beams applied to first detector (42) and second detector (44) of said plurality of detectors being double-diffracted beams from one mask grating (16/18) followed by diffraction from the other mask grating (18, 16) followed by diffraction from said wafer grating (20).

12. A high-precision alignment system according to claim 11, wherein said mask diffraction gratings and said wafer diffraction gratings have lines which are perpendicular to a first axis and have spatial frequencies related by a certain ratio:

$$v_r / v_s$$

where $v_r$ is the number of lines per unit distance in the mask gratings and $v_s$ is the number of lines per unit distance in the wafer gratings, one or more diffraction orders (35, 37) produced by diffraction of one of the mask diffraction orders (30) incident on said wafer grating (20) traveling collinearly with at least one wafer diffraction order (31, 29) produced by diffraction of the other mask diffraction order (32) incident on said wafer grating (20).

13. A high-precision alignment system according to claim 12, additionally comprising:
an additional set each of mask/wafer displacement signal generating means (a), modulated frequency-stabilized laser means (b), optical resonator means (c), power locking feedback means (d), and correction signal feedback means (e), said additional mask/wafer displacement signal generating means including detector means arranged to detect diffraction order orthogonal to those detected by said set of detector means, providing heterodyne signals for relative positioning of mask and wafer in two orthogonal axes.

14. A high-precision alignment system according to claim 12, wherein said modulated frequency-stabilized laser means (b) comprises means to illuminate said mask gratings (16, 18) at normal incidence; wherein the $E(1)$ diffraction order (30) from said first mask grating (16) produces $E(1,1)$ and $E(1,2)$ wafer diffraction order (35,37); wherein $E(-1)$ diffraction order (32) from said second mask grating (18) produces $E(-1,-1)$ and $E(-1,-2)$ wafer diffraction orders (29,31); and the mask and wafer grating spatial frequencies, $v_r$ and $v_s$ respectively, are related by $v_s = (2M/3)v_r$; where M is the reduction ratio of said projection lens (14), so that E(1,1) and E(−1,−2) wafer diffraction orders (35,31) travel collinearly and E(−1,−1) and E(1,2) wafer diffraction orders (29,37) travel collinearly.

15. A high-precision alignment system according to claim 12, wherein said modulated frequency-stabilized laser means (b) comprises means to illuminate said mask gratings (16, 18) at normal incidence; wherein E(1) diffraction order (30) from said first mask grating (16) produces E(1,1) wafer diffraction order (39); wherein E(−1) diffraction order (32) from said second mask grating (18) produces E(−1,−1) wafer diffraction order (41); and the mask and wafer grating spatial frequencies, $v_r$ and $v_s$ respectively, are related by $v_r = v_s/M$, where M is the reduction ratio of said projection lens (14), so that E(1,1) and E(−1,−1) wafer diffraction orders (39,41) travel collinearly.

16. A high-precision alignment system according to claim 10, wherein each mask (10) includes at least one diffraction grating (16, 18) and each wafer (12) includes a plurality of wafer diffraction gratings (20) including first wafer diffraction grating and second wafer diffraction grating; a plurality of selected diffraction orders from one said mask grating are collected by the projection lens (14) and made to be incident, one each, on said wafer wafer diffraction gratings, the two beams applied to first detector (42) and second detector (44) of said plurality of detectors being double-diffracted beams from one mask grating (16/18) followed by diffraction from said first wafer diffraction grating followed by diffraction from said second wafer diffraction grating.

* * * * *